United States Patent [19]
Arimoto et al.

[11] Patent Number: 5,907,488
[45] Date of Patent: *May 25, 1999

[54] METHOD OF EVALUATING EASINESS OF WORKS AND PROCESSINGS PERFORMED ON ARTICLES AND EVALUATION APPARATUS

[75] Inventors: Syoji Arimoto, Kamakura; Yuuzoo Hiroshige, Yokohama; Kiyoshi Suzuki, Hitachi; Tatsuya Suzuki, Yokohama; Toshijiro Ohashi, Chigasaki, all of Japan

[73] Assignee: Hitachi, Ltd., Tokyo, Japan

[*] Notice: This patent is subject to a terminal disclaimer.

[21] Appl. No.: 08/716,017

[22] Filed: Sep. 19, 1996

Related U.S. Application Data

[63] Continuation of application No. 08/290,769, filed as application No. PCT/JP93/01922, Dec. 28, 1993, Pat. No. 5,586,022, which is a continuation-in-part of application No. 07/861,302, Mar. 31, 1992, abandoned, application No. 07/726,997, Jul. 28, 1991, abandoned, and application No. 07/654,236, Feb. 12, 1991, abandoned, said application No. 07/861,302, is a continuation-in-part of application No. 07/726,997, which is a continuation-in-part of application No. 07/654,236.

[30] Foreign Application Priority Data

| Feb. 14, 1990 | [JP] | Japan | 2-031583 |
| Jul. 11, 1990 | [JP] | Japan | 2-181393 |
| Apr. 4, 1991 | [JP] | Japan | 3-071488 |
| Dec. 28, 1992 | [JP] | Japan | 4-347687 |

[51] Int. Cl.[6] .................................................. G06F 17/50
[52] U.S. Cl. ........................ 364/468.03; 364/468.15; 364/512; 705/29
[58] Field of Search ........................ 364/551.02, 512, 364/468.03, 468.15, 552, 468.01, 478.02, 478.05; 395/229, 919; 705/29, 400

[56] References Cited

U.S. PATENT DOCUMENTS

| 4,213,183 | 7/1980 | Barron et al. | 364/507 |
| 4,849,879 | 7/1989 | Chinnaswamy et al. | 395/60 |

(List continued on next page.)

FOREIGN PATENT DOCUMENTS

| 88480026 | 9/1988 | European Pat. Off. . |
| 91111408 | 7/1991 | European Pat. Off. . |

(List continued on next page.)

OTHER PUBLICATIONS

Micro–Computer Based program to code and Analyze the manual Assembly of Small Part (Design For Manufacturability, Report 12); G. Boothroyd, PI, M. Roe, G.A. Russell. pp. 1–48, Sep. 1980.

(List continued on next page.)

*Primary Examiner*—John Barlow
*Assistant Examiner*—Bryan Bui
*Attorney, Agent, or Firm*—Fay Sharpe Beall Fagan Minnich & McKee

[57] ABSTRACT

A method of evaluating quantitatively in a design stage degrees of difficulty of works and processings to be performed on an article or parts at various stage of life thereof such as manufacturing, sale, use, maintenance/inspection/repair, recovery, dismantling, disassembling, recycling for resources, nontoxication and scrapping. Part elimination scores $E_i$ representing degrees of difficulty of the works and processings to be performed on the parts are regarded to be a function of indexes indicating the degrees of difficulty of the works and the processings for the parts and expressed by $E_i=f(G_i)$, while an article evaluation score E representing the degrees of difficulty of the work and the processing for the article is regarded to be a function of a mean value of the part evaluation scores $E_i$ or an index G ($=\Sigma G_i$) indicating the degrees of difficulty of the work and the processing for the article and expressed by $E=f(G)=f(\Sigma G_i)$. Further, work and processing costs for the article under evaluation or parts are estimated on the basis of work and processing costs required really for an article or parts bearing similarity to the article under evaluation or parts thereof.

7 Claims, 13 Drawing Sheets

U.S. PATENT DOCUMENTS

| | | | |
|---|---|---|---|
| 4,916,624 | 4/1990 | Collins et al. | 364/470 |
| 4,931,944 | 6/1990 | Richter et al. | |
| 5,058,026 | 10/1991 | Kunii et al. | 364/468 |
| 5,109,337 | 4/1992 | Ferriter et al. | 364/468.03 |
| 5,586,022 | 12/1996 | Arimoto et al. | 364/468.03 |

FOREIGN PATENT DOCUMENTS

| | | |
|---|---|---|
| 1-116766 | 10/1987 | Japan . |
| 2-58853 | 4/1990 | Japan . |
| 4-069703 | 4/1992 | Japan . |
| 4-217445 | 7/1992 | Japan . |
| 5-081291 | 2/1993 | Japan . |
| 5-114003 | 7/1993 | Japan . |

OTHER PUBLICATIONS

The Hitachi Assemblability Evaluation Method (AEM) and Its Applications; Satoshi Inoshita and Tatguya Shigguura; pp. 99–114, 1988.

Managing Distributed Engineering Databases, Machine Design, Jun. 21, 1990, pp. 42–47 (no author's name).

Understanding Generative Process Planning, Machine Design, May 10, 1990, pp. 50–54 (no author's names).

Statistical Control of VLSI Fabrication Process, IEEE, Mozumder and Strojwas, Feb. 1990 (no pages).

FIG. 4

| BASIC ELEMENT | | BASIC ELIMINATION SCORE (εx) NOTE | DISASSEMBLING COST (Cx) | DISASSEMBLING TIME (Tx) | DISASSEMBLING COST INDEX (Ix) |
|---|---|---|---|---|---|
| NAME | SYMBOL (X) | | | | |
| DOWNWARD MOVE | ↓ | 0 | 50 | 0.50 | 100 |
| LATERAL MOVE | ↑ | 10 | 75 | 0.75 | 150 |
| HOLD | F | 20 | 100 | 1.00 | 200 |

OTHERS ARE OMITTED

FIG. 5

NOTE: $\alpha n = [C_{xyz}/C_x] \times$ mean

| NAME | SYMBOL (y) | SUPPLEMENTARY ELEMENT (Y) | | | SUPPLEMENTARY COEFFICIENT ($\alpha n$) | | DISASSEMBLING COST ($C_{yxn}$) | |
| --- | --- | --- | --- | --- | --- | --- | --- | --- |
| | | CLASSIFICATION | | | NUMERICAL VALUE | SYMBOL ($\rho$) | X: ↓ | X: → |
| | | n | SYMBOL (yn) | CONTENTS | NOTE | | | |
| MATERIAL | m | 1 | S | COPPER | 1.0 | $\rho$ | 50 | 75 |
| | | 2 | A | ALUMINUM | 0.9 | | 45 | 68 |
| | | 3 | | | | | | |
| SIZE | l | 1 | | | | $\lambda$ | 50 | 75 |
| | | 2 | | | | | | |
| | | 3 | | | | | | |

OTHERS ARE OMITTED

FIG. 6

RESULT OF DISASSEMBLABILITY EVALUATION
(IN DESCENDING ORDER OF EVALUATION SCORES)

| NAME OF ARTICLE | NUMBER OF PARTS | ESTIMATED DISASSEMBLING TIME | ESTIMATED DISASSEMBLING COST : (yen) | REDUCTION RATIO % OF DISASSEMBLING COST<br>0  50  100 | ESTIMATED ARTICLE DISASSEMBLABILITY EVALUATION SCORE<br>-100  0  100 |
|---|---|---|---|---|---|
| EVALUATED ARTICLE DEM2-11 | 3 | 5.39 | 699.83 | | 76********* |
| STANDARD ARTICLE | | | | | |

| DESCENDING EVALUATION SCORE ORDER | INPUT ORDER | PART NAME | NUMBER OF PARTS | ESTIMATED DISASSEMBLING TIME | ESTIMATED DISASSEMBLING COST : (YEN) | REDUCTION RATIO % OF DISASSEMBLING COST<br>0  50  100 | ESTIMATED ARTICLE DISASSEMBLABILITY EVALUATION SCORE : PARENTHESIZED NUMERICAL VALUES ARE EVALUATION SCORES OF PART STANDARDS<br>-100  0  100 |
|---|---|---|---|---|---|---|---|
| 1 | 3 | C | 1 | 2.68 | 347.85 | | 50***** |
| 2 | 2 | B | 1 | 1.71 | 221.98 | | 79********* |
| 3 | 1 | A | 1 | 1.00 | 130.00 | | 100********** |

FIG. 10

| BASIC ELEMENT | |
|---|---|
| NAME | SYMBOL |
| UPWARD MOVE | ↑ |
| LATERAL MOVE | → |
| SCREWWISE ROTATION | ⊕↺ |

FIG. 11

| BASIC ELEMENT | |
|---|---|
| NAME | EXAMPLES OF CONTENTS |
| MATERIAL | IRON<br>NONFERROUS METAL<br>PLASTIC |
| SIZE | WEIGHT<br>LENGTH |
| HEIGHT OF ARTICLE | HIGH POSITION<br>LOW POSITION |

FIG. 12

| PART INFORMATION | | BASIC ELEMENT | SUPPLEMENTARY ELEMENT | CONTENTS OF WORK AND PROCESSING | INDEXES INDICATING DEGREES OF DIFFICULTY |
|---|---|---|---|---|---|
| NAME | SCREW | SCREWWISE ROTATION | DEEP HOLE | 1. TAKE SCREW-DRIVER<br>2. MOVE DRIVER TOWARD SCREW<br>3. ROTATE SCREW<br>4. MOVE DRIVER AWAY FROM PART<br>5. PICK UP SCREW AND HOLD IN HAND | 50<br><br>15 DEEP HOLE CORRECTION ×1.1 |
| NUMBER OF PARTS | 2 | UPWARD MOVE | | 6. MOVE SCREW-DRIVER TOWARD SCREW<br>7. ROTATE SCREW<br>8. MOVE DRIVER AWAY FROM PART<br>9. PICK UP SCREW AND PLACE IN COLLECTING BOX<br>10. STORE DRIVER | 50<br><br>23 DEEP HOLE CORRECTION ×1.1 |
| | | | | SUM TOTAL VALUE | 152 |

FIG. 13

| PART INFORMATION | | BASIC ELEMENT | SUPPLEMENTARY ELEMENT | CONTENT OF WORK AND CORRECTION | INDEX INDICATING DEGREE OF DIFFICULTY |
|---|---|---|---|---|---|
| NAME | COVER | UPWARD MOVE | | 1. LIFT THE PART AND PLACE WITHIN COLLECTING BOX | 14 |
| NUMBER OF PART | 1 | | | | |
| | | | | SUM TOTAL VALUE | 14 |

METHOD OF EVALUATING EASINESS OF WORKS AND PROCESSINGS PERFORMED ON ARTICLES AND EVALUATION APPARATUS

CROSS-REFERENCE TO RELATED APPLICATIONS

The present application is a continuation application of copending U.S. patent application Ser. No. 08/290,769, filed Aug. 15, 1994, now U.S. Pat. No. 5,586,022, which is the U.S. national stage of PCT internatioal application PCT/JP93/01922, filed Dec. 28, 1993, entitleId "Method of Evaluating Easiness of Works and Processings Performed on Articles and Evaluation Apparatus, which is" a continuation-in-part application of copending U.S. patent application Ser. No. 654,236 filed on Feb. 12, 1991 abandoned under the title "METHOD AND APPARATUS FOR EVALUATING OPERABILITY OF ARTICLE" and assigned to the same assignee as the present application, copending U.S. patent application Ser. No. 726,997 filed on Jul. 8, 1991 now abandoned which is a continuation-in-part application of the above-mentioned copending U.S. patent application Ser. No. 654,236 and entitled "METHOD OF EVALUATING OPERABILITY OF ARTICLE AND APPARATUS FOR CARRYING OUT THE SAME", and copending U.S. patent application Ser. No. 861,302 filed on Mar. 31, 1992 now abandoned under the title "AUTOMATIC MANUFACTURABILITY EVALUATION METHOD AND SYSTEM" which is a continuation-in-part application of U.S. patent application Ser. No. 726,997 also filed as a continuation-in-part application of the above-mentioned copending U.S. patent application Ser. No. 654,236.

TECHNICAL FIELD

The present invention relates to a method of designing an article or a part so that works and processings which the article or part is to undergo can be facilitated. In particular, the present invention quantitatively evaluates influences such as size, shape, structure or material which factor into easiness of the work and the processing of the article or the part at different stages of maintenance/inspection/repair, dismantling, disassembling and recycling for resources. The evaluation furnishes a guideline for enhancing easiness of the work and processing together with results of evaluation with the guideline and results time or costs involved in the works and processings which the article or the part undergoes at various stages of the life thereof such as the stages of manufacture or production, sale, use, maintenance/inspection/repair, recovery, dismantling, disassembling, recycling for resources, nontoxication and scrapping (or depositing). Further the invention is concerned with an apparatus for automatically executing the evaluation and providing a guideline for enhancing easiness of the works and the processings.

BACKGROUND ART

As a procedure known heretofore for evaluating whether works and processings or treatments to be performed on an article at various life stages thereof are easy or not, there can first be mentioned a method according to which a designer is furnished with a check sheet for checking whether or not requisite items as listed are satisfied. A second method is a so-called design review method according to which the person skilled in design and implementation techniques judges the degree of easiness of the work and the processing or treatment which an article is to undergo on the basis of his or her experience to thereby point out those items which can be improved. Thirdly, an assemblability evaluation method and a processability evaluation method which are directed to the assembling and the processing or treatment as particular types of works may be mentioned.

As for the first and second procedures mentioned above, there are a contribution entitled "KANKYO HOZENGATA SEIHIN SEKKEI NO SUSUME (RECOMMENDATIONS FOR ENVIRONMENT PRESERVATION TYPE PRODUCT DESIGNS)" contained in "NIKKEI NEW MATERIALS", pp. 14–25, (Jun. 10, 1991) and others. As for the techniques which concern the third evaluation method, there can be mentioned that disclosed in Japanese Unexamined Patent Application Publications Nos. 69703/1992 and 114003/1993 (JP-A-H4-699703 and JP-A-H5-114003).

It is most desirable from the view point of effectiveness to examine or study sufficiently or adequately at the stage of designing an article whether the works and processings or treatments which the article undergoes at various life cycles or stages such as manufacturing, sale, use, maintenance/inspection/repair, recovery, dismantling, disassembling, recycling for resources, nontoxication, scrapping (or depositing) so that the results of the examination are reflected to the implementation of the article.

In order to realize the above, there is required some preparatory evaluation method. Additionally, it is also necessary to perform design improvement on the basis of evaluation indexes as determined by the evaluation method.

In view of the demand mentioned above, there have heretofore been published several preparatory evaluation methods such as mentioned above. However, most of the publicly known methods suffer from problems mentioned below and could not be applied to the evaluation concerning the maintenance/inspection/repair, dismantling and the recycling for resources. Namely, (1) Most of the hitherto known evaluation methods are only check lists containing items of "should" or "should not" type, wherein the indexes for evaluation as determined are necessarily of a qualitative nature, rendering it impossible to make a quantitative evaluation.

(2) Abundant experience and knowledge are required for the evaluation.

(3) Information which can be derived concerns only the times or costs involved in the works and the processings or treatments, making it difficult to determine whether design is satisfactory or not.

(4) Evaluation can be effected only upon completion of design or at a time point close thereto, which means that the design having undergone the evaluation is difficult to improve.

(5) Since only easiness of the work and the processing or treatment is the subject matter for the evaluation, difficulty is encountered in attempting improvement of the design on the basis of the results of the evaluation.

(6) Consideration is paid only to easiness of the works involved in manufacturing an article or part. It is impossible to evaluate easiness of the works and the processings or treatments at various life stages such as the maintenance/inspection/repair, dismantling, disassembling and the recycling for resources.

(7) Because the object for evaluation is a uniformized or standardized work mode upon manufacturing an article or a part, it is impossible to cope with calculation of times or costs involved in the works and the processings or treatments which are complicated in respect to the execution modes such as exemplified by the maintenance/inspection/repair, dismantling and the disassembling.

(8) Availability of information for the design improvement from the results of the evaluation depends solely on the experiences of the evaluator, which is thus accompanied with degradation in the efficiency.

DISCLOSURE OF INVENTION

An object of the present invention is to provide an evaluation method immune to the problems enumerated above and which features (1) quantitative evaluation, (2) unnecessity of abundant experience and knowledge, (3) availability of the indexes which allow the designs to be discriminated between the good and the bad, (4) capability of evaluation even at an earlier stage of design, (5) availability of instances to be referenced for design improvement, (6) capability of evaluating easiness of the works and the processings or treatments at various stages of life of an article or a part such as the maintenance/inspection/repair, dismantling, disassembling and the recycling for resources among others, (7) capability of coping with complicated work modes such as the maintenance, dismantling and the disassembling, and (8) capability of supporting or promoting activities for design improvement by utilizing the results of the evaluation, and an apparatus for automatically performing the evaluation and aiding the design improvement activities.

For achieving the object mentioned above, the present invention provides a method of evaluating easiness of a work and a processing. According to the method a plurality of elements fundamental for the work and the processing or treatment are classified in correspondence to the contents of the work and the processing of an article under evaluation or parts thereof and defined as basic elements. Factors concerning states of the article or the parts thereof which influence the easiness of the work and the processing performed on the article or the parts are extracted as supplementary elements in addition to the aforementioned basic elements.

On the basis of the information concerning the work and the processing or treatment of the article or the parts thereof under evaluation and derived from the basic elements, the supplementary elements and others, an operation estimation database is prepared for use in estimating the contents of the work and the processing or treatment to be actually performed on the article or the parts thereof. Detailed contents of the work and the processing or treatment for the article or the parts thereof are derived by making use of the database.

For the contents of the work and the processing or treatment derived on the basis of the aforementioned database, there are prepared basic indexes indicating degrees of easiness or difficulty for individual works and processings or treatments, respectively. These basic indexes are determined on the basis of times and costs as involved in the individual works and processings or treatments or alternatively indexes of the times and the costs in accordance with functions or function formulae defined for comparison purpose. It is desirable that the basic indexes are so determined that values for the comparisons are less susceptible to changes even if environmental conditions for the works and the processings or treatments (number of works and processings or treatments, procedures of works and processings or treatments, facilities for the works and the processings or treatments) change.

Further, an article or a part having standard states serving as standards or references for an article or a part of concern is determined. When times or costs involved in a work and a processing or treatment to be performed on the article or the part of concern as determined in accordance with the aforementioned functions or formulae or alternatively indexes of the times or the costs mentioned above, increase beyond the times or the costs required for the work and the processing or treatment of the standard article or part, easiness indexes indicating the degrees of easiness or difficulty of the work and the processing or treatment to be performed on the article or the part of concern are computed in accordance with functions or functional formulae which decrease or increase the easiness indexes from predetermined values, respectively, to thereby calculate indexes of easiness for the work and the processing or treatment for the article or the part of concern.

For calculation of the index indicating easiness of a work and a processing for an article or a part, it is desirable that a sum total of times or costs required for the works and the processings of an article standard or a part standard which follows a standard route (singular or plural) such as, for example, "manufacturing→sale→use→recovery→disassembling→manufacturing" is compared with a sum total of times or costs required for the works and the processings of an article or a part under evaluation which may follow a route including additional stages for "regeneration, etc." relative to the aforementioned standard routine under the same environmental condition as that for the standards, wherein the index indicating easiness of the works and the processings for the article or part under evaluation is arithmetically determined in accordance with a function formula or a function which decreases or increases a value relative to a comparison value which is less susceptible to change even when the environmental condition changes.

For evaluating the easiness of work and processing to be performed on an article which is represented by an assembly of parts, the times or costs required for works and processings to be performed on one or more parts constituting an article are calculated, which is then followed by calculation of the easiness index(s). A wherein a sum total of the times or costs required for the works and the processings for the individual parts as calculated represents the time or cost required for the work and the processing for the article of concern as a whole. When the sum total of the times or the costs mentioned above increases beyond a sum total of times required for the works and the processings to be performed on the standard parts under the same environment conditions as those under which the works and the processings are performed on the article of concern, the easiness index of the work and the processing of the article indicating the degree of easiness or difficulty of the work and the processing for the article of concern as a whole is calculated in accordance with a function or a function formula which decreases or increases the easiness index from a predetermined value. Further, concerning the work and processing easiness index for an article under evaluation, the work and processing easiness indexes are calculated for one or more parts constituting the article in accordance with the method mentioned above, whereupon the work and processing easiness index for the article of concern is calculated in accordance with a function formula or a function prescribed to determine a mean value of the part work and processing easiness indexes for the one or more parts as calculated, whereby evaluation can be executed speedily and easily.

Further, by comparing the calculated times or costs required for the work and the processing of an article under evaluation or parts thereof with real values of times or costs involved in the work and the processing performed on an existing article or parts thereof which bear similarity to those under evaluation, the times or costs required for the work and the processing for the article under evaluation or parts thereof can be determined with higher accuracy. By using a function or a function formula for comparing the work and processing easiness index of the article under evaluation or parts thereof with the work and processing easiness index of a similar existing article or parts thereof, effectiveness of improvement of an article or parts thereof can be given more definitely, which in turn means that the practical usability of the result of evaluation can further be enhanced.

Additionally, by deciding whether easiness of the work and the processing of an article under evaluation or parts thereof is satisfactory or not on the basis of the work and processing easiness calculated through the above-mentioned procedure, and then automatically searching an improvement instance database for a corresponding improvement instance on the basis of the result of the above decision and contents of the work as estimated by an analysis database to thereby display one or more instances which can assure improvement of high effectiveness, it is possible to provide a guideline for the design improvement.

Further, the designer can register improvement instances in the improvement instance database. Thus, it is possible to cumulatively store the know-how knowledge for thereby reinforcing the improvement instance database.

A work and processing easiness evaluating apparatus for carrying out the aforementioned methods according to the present invention includes an input unit, a storage unit, an arithmetic unit and a display unit. The input unit has a function for fitting at least one basic element and supplementary element, if necessary, which are comparable to work and processing to be performed on the article under evaluation or parts thereof, respectively. The storage unit has a function for storing input data such as the basic elements and others for articles or parts thereof, respectively, as inputted through the input unit, an analysis database, an improvement instance database, contents of works and processings estimated for articles or parts on the basis of the input data and the analysis database, function formulae, functions used for calculating times or costs and the easiness indexes of the works and the processings of articles or parts and results of arithmetic operations for the evaluation. The arithmetic unit has a function for estimating the contents of works and processings for articles or parts on the basis of data read out from the storage unit, and a function for calculating indexes indicating degrees of difficulty or easiness of works and processings for an article under evaluation or parts thereof on the basis of the estimated contents of the work and the processing for the article under evaluation or parts thereof. The display unit has a function for displaying and outputting indexes indicating degrees of difficulty or easiness of the works and the processings as calculated by the arithmetic unit.

According to the aforementioned evaluation method of the invention, easiness of the works and the processings to be performed on an article or parts thereof at the stage of the maintenance/inspection/repair, dismantling, disassembling or the recycling for resources can be represented in the form of the work and processing easiness indexes determined on the basis of times or costs involved in the works and the processings.

The basic elements and the supplementary elements mentioned previously can easily be extracted from the contents of a design drawing as well as article or parts without need for any special skill, research, experiment or the like.

The contents of the works and the processings estimated on the basis of the input information such as the extracted basic elements, supplementary elements, etc. can be totalized or averaged through simple calculation (e.g. a low-point method of scoring or elimination score method, a high-point method of scoring, an exponential method or the like), whereby easiness of the works and the processings to be performed on an article under evaluation or parts thereof can be expressed in terms of indexes.

By correcting the above-mentioned basic index by a supplementary index, accuracy of the evaluation can further be increased.

By applying the evaluation method described above to an article which is an assembly of parts, easiness of works and processings to be performed on the article as a whole can be expressed in terms of index.

Further, display of an improvement instance extracted from the improvement instance database can contribute to the design improvement. Besides, know-how elements can be employed in the evaluation method according to the invention by configuring correspondingly the improvement instance database.

Furthermore, with the arrangement of the apparatus according to the present invention, elements for evaluation of article or parts (the basic elements, supplementary elements, etc.) can be inputted through the input unit. These elements for evaluation can be stored in the storage unit together with the analysis database, the improvement instance database, the functions, the function formulae and others. On the other hand, the arithmetic unit can estimate operations involved in work and processing to be performed on a part, calculate the indexes indicating the degrees of difficulty or easiness of the work and the processing for the part, and then calculate the index indicating the degree of difficulty of works and processing to be performed on an article as a whole. The display/output unit can display the results of these calculations. Thus, the method of the present invention can be performed speedily and accurately. In other words, the apparatus can be so implemented as to carry out most appropriately the method according to the invention.

BRIEF DESCRIPTION OF DRAWINGS

FIG. 4 is a view showing basic elements together with contents thereof involved in a disassembling work according to the present invention.

FIG. 5 is a view showing supplementary elements together with contents thereof in the disassembling work according to the present invention.

FIG. 6 shows, by way of example, results of the evaluation arithmetics as outputted.

FIG. 10 shows, by way of example, basic elements involved in a disassembling work according to the present invention.

FIG. 11 shows examples of supplementary elements involved in a disassembling work according to the present invention.

FIG. 12 shows, by way of example, results of analysis performed by using an analysis database and examples of indexes indicating degrees of difficulty in a disassembling work according to the present invention.

FIG. 13 shows, by way of example, results of evaluation of work and processing for an article or part having states serving as standards. And, FIG. 14 is a chart illustrating an evaluation process according to a second embodiment of the present invention.

BEST MODE FOR CARRYING OUT THE INVENTION

Embodiment 1

Figure 1:
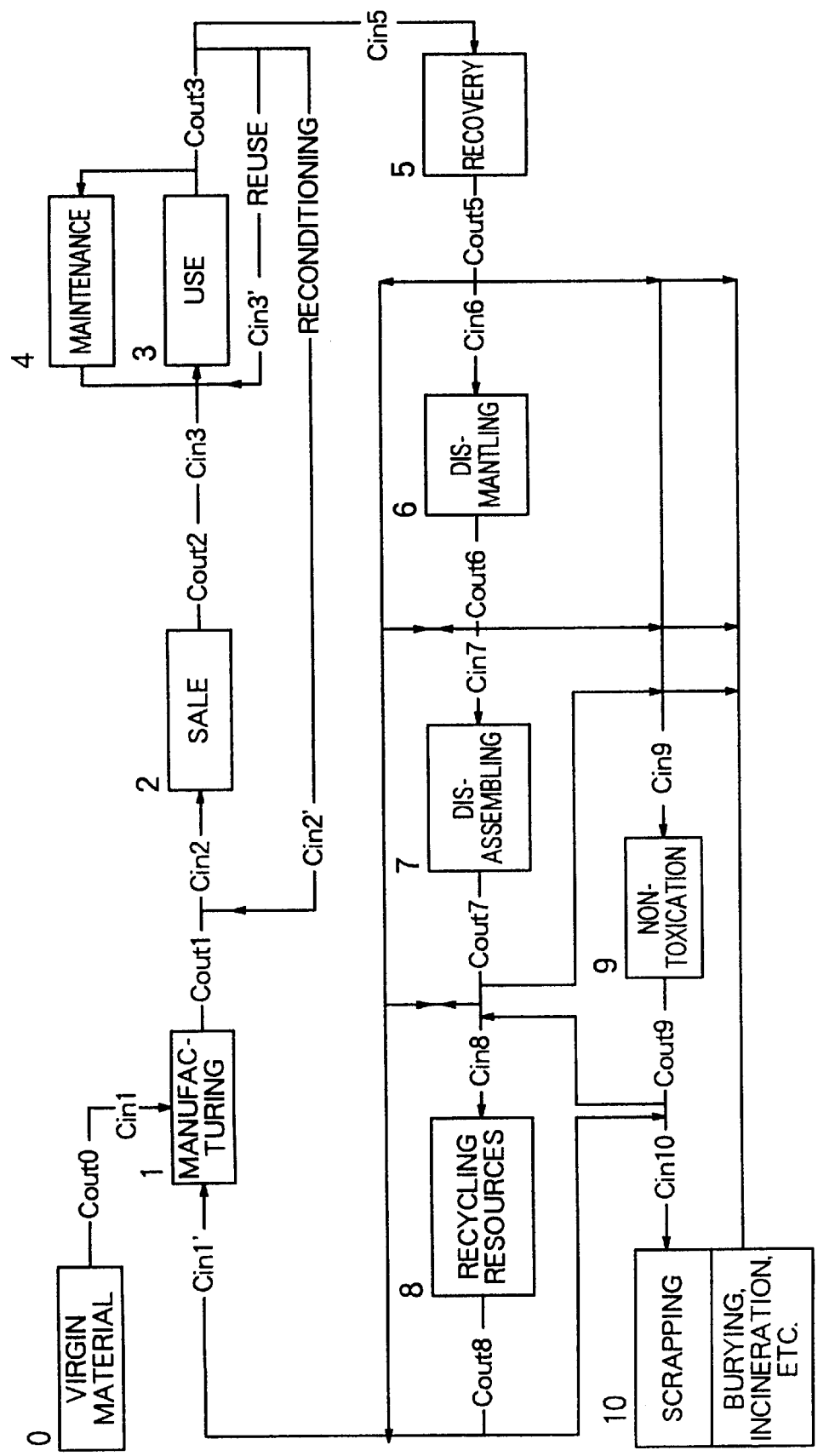
FIG. 1 is a schematic diagram illustrating a life of an article and various works which the article undergoes.

In the following, by reference to FIG. 1, description will briefly be made concerning stages of a life of an article such as manufacturing, sale, use, maintenance/inspection/repair, recovery, dismantling, disassembling, recycling for resources, nontoxication and scrapping (or depositing) as well as various works which the article undergoes.

Manufacturing 1: At the stage of the manufacturing 1, an article or product is manufactured through manufacturing works (e.g. assembling work, processing or machining work, inspection work, etc.) and manufacture processing (e.g. purchase of materials, parts, electric power, fuel, etc., treatments by chemical reactions, etc.).

Sale 2: At the stage of the sale 2, the article as manufactured is delivered to the market after sale works (e.g. transportation work, exhibition work, examination work, etc.) through distribution routes and sale processings (e.g. purchase of materials, electric power, fuel and others).

Use 3: At the stage of the use 3, the article purchased by a user undergoes works or operations involved in the use (e.g. control operation, adjusting operation, installing operation, etc.) and processings involved in the use (e.g. purchase of materials, electric power, fuel, treatment by chemical reactions, etc.). The article passed through the use stage 3 may be assigned to another user. In this case, the use stage 3 is resumed.

Maintenance/Inspection/Repair 4: At the maintenance/inspection/repair stage 4, the article may undergo in the course of its use, maintenance/inspection/repair works (e.g. inspection work, adjusting work, exchange work, etc.) and maintenance/inspection/repair processings (e.g. purchase of materials, electric power, fuel, etc., treatments by chemical reactions, etc.). In this case, when a part or article is found to be replaced, the part or article will undergo recovery work and recovery processing at the recovery stage 5.

Recovery 5: At the recovery stage 5, the article fulfilling the use cycle undergoes recovery work (e.g. transportation work, classification work, work for recovering chemical compositions, etc.) and recovery processing (e.g. purchase of electric power, fuel and others, treatment by chemical reaction, etc.). The articles as recovered may follow several different routes such as a route leading directly to the manufacturing stage 1, a route leading to a dismantling stage 6 for classification and separation of materials, a route leading directly to a recycling stage 8, and others.

Dismantling 6: At the dismantling stage 6, the article undergoes dismantling works (e.g. dismantling work, machine manipulating or operating work, selective separation of parts or subassemblies, classification work, etc.) and dismantling processings (e.g. purchase of electric power, fuel and others, disintegration treatment by chemical reaction, etc.) to be thereby disintegrated to parts or subassemblies, which may follow several different routes in depending on the types thereof. Some will directly be transferred to the manufacturing stage 1 and some will be transported to the scrapping stage 10, while those made of materials having toxicity will follow a route leading to the nontoxication stage 9 with others being sent to the recycling stage 8.

Disassembling 7: The article arriving at the disassembling stage undergoes disassembling works (e.g. disassembling work, manipulation of machines for disassembling, selective separation of parts and subassemblies, article-based classification, etc.) and disassembling processing (e.g. purchase of electric power, fuel and others, disintegration treatment by chemical reactions, etc.) to be thereby disassembled into parts or subassemblies, which may follow several different routes depending on the types thereof. Some will be moved backward to the manufacturing stage 1, some will be fed to the scrapping stage 10, some will be transferred to the nontoxication stage 9 when they are made of materials of toxicity while others may follow the route leading to the recycling stage 8.

Recycling for resources 8: At the recycling stage 8, the parts or subassemblies undergo works for recycling for resources (e.g. manipulation of equipment, etc.) and recycling treatments (e.g. purchase of electric power, fuel, etc., recycling treatments through chemical reactions) to be thereby fed back to the manufacturing stage 1. In this case, however, the parts or subassemblies are not necessarily used for manufacturing the original article but may be used for manufacturing other articles. Further, the parts or subassemblies may follow the route leading to the scrapping stage 10 or the route leading to the nontoxication stage 9 when they are made of toxic material(s).

Nontoxication 9: The parts or subassemblies arriving at the nontoxication stage 9 undergo non-toxicating works (e.g. operations of machines and instruments) and nontoxicating processings (e.g. purchase of electric power, fuel and others, nontoxicating treatment by chemical reactions, etc.) and may follow several different routes including the route leading to the manufacturing stage 1, the route leading to the scrapping stage 10, the route leading to the recycling stage 8, and others.

Scrapping 10: At the scrapping stage 10, the article, parts or subassemblies thereof undergo scrapping works (e.g., transportation work, work for manipulating or operating machines, burning, etc.) and scrapping treatments (e.g. purchase of electric power, fuel and others, scrapping treatment through chemical reactions, reuse processing of thermal energy as obtained by burning, etc.) to be ultimately scrapped.

As an exemplary embodiment of the present invention, description will be directed to an article disassembling evaluation method.

Figure 2:
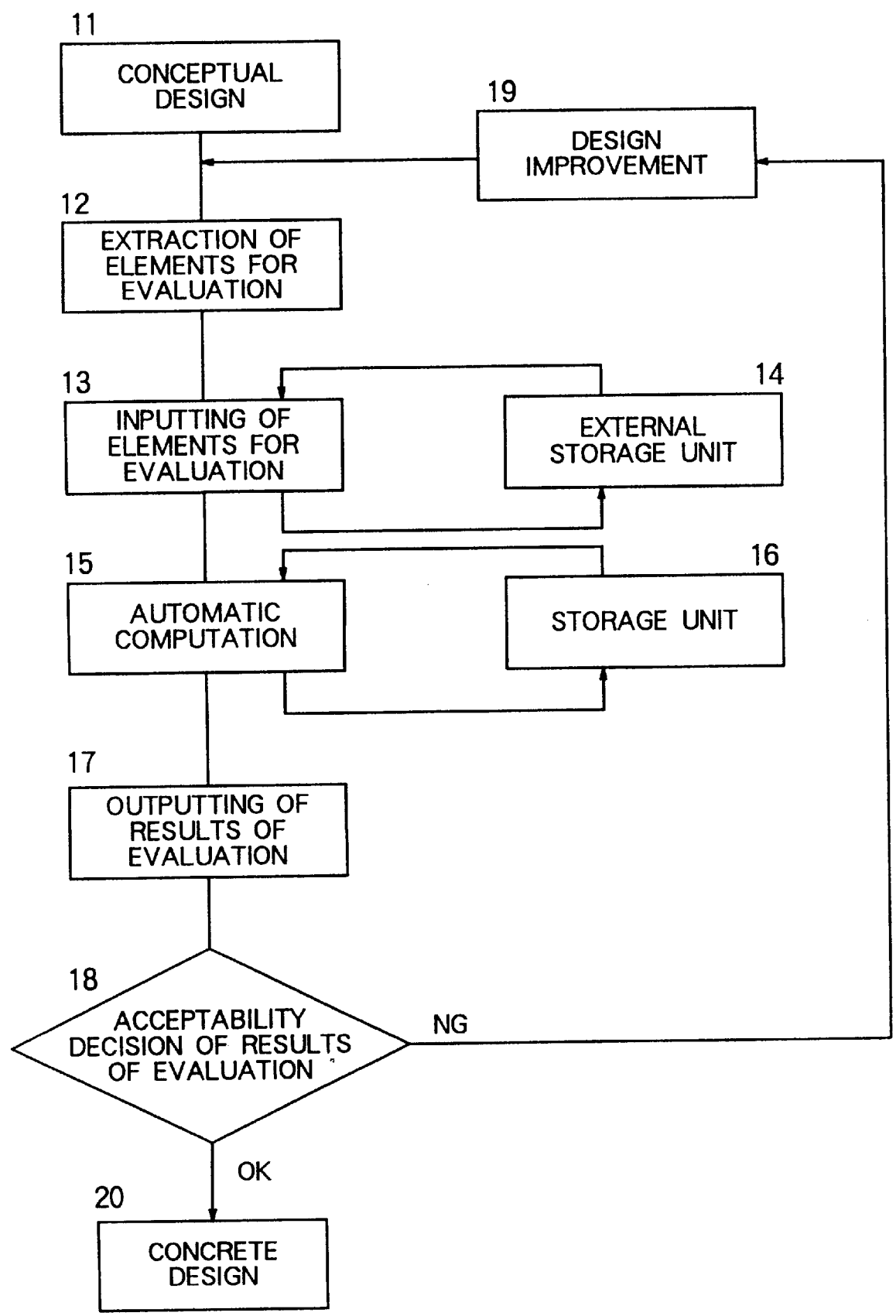
FIG. 2 is a basic flow chart illustrating a design procedure and evaluation arithmetics for an article or parts thereof according to the present invention.

FIG. 2 shows a basic flow for a design procedure of an article or parts thereof and evaluation arithmetics. In a conceptual design step 11, an article or parts thereof are designed conceptually. At this stage, elements for evaluation such as the basic elements and others, are extracted from a conceptual design drawing or an existing model of an article or parts of concern in an evaluation element extraction step 12, which is then followed by an evaluation element inputting step 13 where the evaluation elements as extracted are inputted to a computer system which incorporates therein an evaluation program. Data as inputted may be stored in an external storage unit 14 as well. In an automatic computation step 15, automatic computation is executed on the basis of information for evaluation while transacting with a storage unit 16. In an evaluation result outputting step 17, results of the evaluation and improvement proposal, if any, are outputted to be displayed. In an evaluation result examination 18, it is determined whether or not improvement of the design is necessary. When it is decided that improvement of the design is necessary, design improvement is performed in a design improvement step 19, while when the improvement proposal is to be accepted, corresponding information is added to the improvement instance information. Upon completion of the design improvement, a concrete design step 20 is executed. Parenthetically, it should be noted that even in the concrete design step 20, the evaluation element extraction 12, the evaluation element inputting 13, the automatic computation 15, the evaluation result outputting 17 and the evaluation result examination 18 may also be executed to thereby effectuate repeatedly the design improvement 19.

Figure 3:
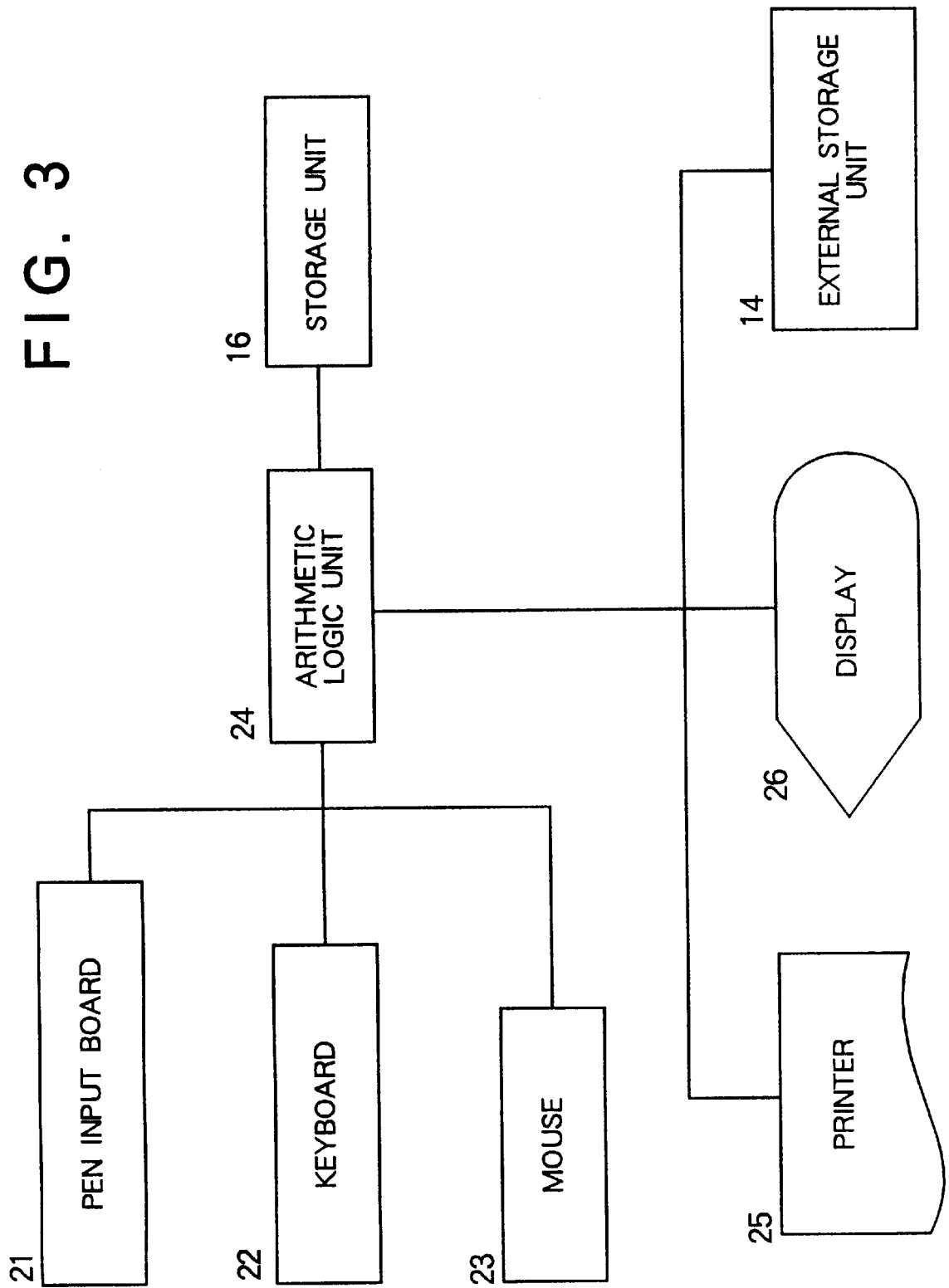
FIG. 3 is a diagram showing a computer system for the evaluation arithmetics according to the present invention.

FIG. 3 shows a computer system incorporating an evaluation program according to the present invention. As hardware, the computer system includes an input unit such as a pen input board 21, a keyboard 22 or a mouse 23, an arithmetic logic unit 24 for executing computations or calculations, the storage unit 16 for storing input data and results of the arithmetic operations, a printer 25 and a display 26 for displaying results of the arithmetic operations, and the external storage unit 14 for storing the results of evaluation and others.

Software incorporated in the hardware is described below. It includes input processing programs for storing as the basic data in the storage unit 16, the basic elements X (indicating disassembling operations or works) and basic elimination scores ex serving as basic indexes as well as names, symbols, numerical values imparted to the basic elements X and the basic elimination scores $\epsilon_X$, as will be elucidated later by reference to FIG. 4. Also included are supplementary elements Y and $Y_n$ and supplementary coefficients $\alpha$ used as supplementary indexes as well as names, symbols, numerical values and others imparted thereto, as will be described hereinafter by reference to FIG. 5. Further included are and data $X_{ij}$ and $Y_{nij}$ for each of the basic elements (disassembling operations or works) sequenced in the evaluation order j for individual parts i to be employed in individual processings for evaluation process, as will be described by reference to FIG. 6. Computation programs are provided for arithmetic determination of part disassemblability elimination scores $e_i$ by correcting basic elimination scores $\epsilon_{Xij}$ given by the corresponding input data with supplementary coefficients $\alpha_{nij}$, calculation of part disassemblability evaluation scores $E_i$ (=100−$e_i$) as the indexes for part disassembling works and part disassembling processings or treatments by using the part disassemblability elimination scores $e_i$, calculation of an article disassemblability evaluation score E as a disassemblability index for the article by using all the part disassemblability evaluation scores $E_i$, calculation of an article disassembling work cost wC or article disassembling work time wT as well as an article disassembling process cost pC or article disassembling process time pT. A program is provided for displaying the results of the calculations mentioned above on the display 26, outputting the same to the printer 25 and storing the data in the external storage unit 14.

FIG. 4 shows, by way of example, contents of the basic elements X resulting from classifications of a disassembling operation. Example 1 concerns an upward move. These basic elements X can be extracted from information, an article or parts thereof, entered or depicted in a design drawing for predetermined disassembling operations as defined. In the case of the instant example, it is assumed that the basic elements X represent operations involved in the disassembling. The same applies in the following description unless specified otherwise.

Referring to FIG. 4, names of the basic elements X are listed in a first column. The number of the basic elements X may be plural. As the number of the basic elements increases, evaluation accuracy can be enhanced, although handling of them becomes complicated. When the number of the basic elements becomes smaller, the evaluation process becomes simplified, although the evaluation accuracy is lessened. It has been found that twenty basic elements is practically most convenient not only for the disassembling but also for the assembling and the processing or machining.

There are entered in a second column of FIG. 4 symbols corresponding to the individual basic elements X, respectively. At this juncture, it should be mentioned that the symbols should preferably be determined so that the corresponding basic elements can easily be associated. By way of example, an upward move is represented by "↑", while a lateral move is represented by "→". Further, listed in a third column of FIG. 4 are exemplary numerical values of the basic elimination scores ex which are allocated to the individual basic elements X, respectively. In the case of the instance now under consideration, the upward move "↑", which represents the easiest disassembling operation, is selected as "a standard element $X_0$", and a standard elimination score $\epsilon_{X0}$ (i.e., a value of a basic elimination score $\epsilon_X$ whose suffix X is given by X0) which is imparted to the standard index A is selected to be "0" (zero). For the other basic elements X, the basic elimination scores $\epsilon_X$ are previously determined so that the basic elimination scores $\epsilon_X$ increase from "0" (zero) as the basic elements X become more difficult to handle when compared with the standard element $X_0$ (i.e., as the disassembling cost $C_X$ for each of the other basic elements X becomes greater than the disassembling cost $C_{X0}$ for the standard element $X_0$, as shown in a fourth column, on the condition that environmental conditions for the disassembling such as the conditions given by the number of disassembling operations and disassembling means exemplified by disassembling facilities as used are same). The aforementioned functional relation can be expressed as follows:

$$\epsilon_X = f_1(C_X) = a_1(C_X - C_{X0}) \quad (1)$$

$$= a_2(C_X / C_{X0} - 1)$$

where $a_1$ and $a_2$ represent constants which bear a relation given by $a_1 = a_2 C_{X0}$.

In its alternative, the aforementioned disassembling cost $C_X$ may be replaced by disassembling time $T_X$ or an index $I_X$ thereof. Further, instead of the above expression for the basic elimination scores $\epsilon_X$, expressions (2), (3) and (4) mentioned below may be used according to which trend of the basic elimination score $\epsilon_X$ to increase/decrease as a function of increase in the disassembling cost $C_X$, becomes different.

$$\epsilon_X = a_3 (1-C_{X0}/C_X) \tag{2}$$

$$\epsilon_X = a_4 (C_X/C_{X0}-1)^\alpha + b_1 \tag{3}$$

$$\epsilon_X = a_5 (1-C_{X0}/C_X)^\alpha + b_2 \tag{4}$$

Further, instead of the basic elimination score $\epsilon_X$, a basic coefficient $\epsilon'_X$ which is greater or smaller than a predetermined value (example 1) and which can be determined in accordance with the following expressions (5), (6) or the like may be employed.

$$\epsilon'_X = c_1 (C_{X0}/C_X)^\beta + d_1 \tag{5}$$

$$\epsilon'_X = c_2 (C_X/C_{X0})^\beta + d_2 \tag{6}$$

In the above expressions (2) to (4), $a_3$, $a_4$, $a_5$, $b_1$, $b_2$, $c_1$, $c_2$, $d_1$, $d_2$ and $\beta$ represent constants, respectively. By selecting these constants appropriately, the trend of the basic index to increase/decrease as a function of increase in the cost or the time involved in handling the basic element, can be varied.

FIG. 5 shows examples of the supplementary element Y. As the supplementary elements Y, there may be mentioned a material $m$, a size $l$ and others.

For these supplementary elements (m, l, . . . ), relatively simple ones are selected and defined as supplementary standards ($m_0$, $l_0$, . . . ), respectively. The state of each supplementary element is classified into $n$ states where $n$ represents a number in a range of one to $n$. These supplementary elements can be designated by extracting them from the information, an article and/or parts depicted in the design drawing, and represent factors which exert influence to the easiness of the part disassembling in addition to the basic elements. For the supplementary elements Y for which supplementary coefficients are previously set forth as supplementary indexes indicating degrees of the influence, supplementary coefficients $\alpha_n$ are determined so that the disassembling cost $C_{xyn}$ for each of the $n$ states as classified increases beyond the disassembling cost for the supplementary standard (for which $C_{xyn}$ is represented by $C_y$), the supplementary coefficient $\alpha_n$ becomes greater than "1" (one) in a proportional relation. Namely, $$\alpha_n = (C_{xyn}/C_{xy0})y_{mean}$$
$$= (C_{xyn}/C_y)y_{mean}$$

where $y_{mean}$, represents a mean value of various values of $y$. Thus, in addition to the supplementary elements having the supplementary coefficients $\alpha_n$ greater than "1" (one), there exist supplementary elements whose supplementary coefficients $\alpha_n$ are smaller than "1" (one) and whose disassembling costs $C_{xyn}$ become smaller than the disassembling cost (represented by $C_y = C_{xyn}$) for the supplementary standard.

Assuming that $C_{yx0} = C_y$ is adopted, $C_{xyn} = C_y$ and $[C_{xyn}]$ $Yn_{means} = C_y$ may also be assumed. Furthermore, in place of the disassembling costs $C_{xyn}$ and $C_{xy0}$, the disassembling times $T_{xyn}$ and $T_{xy0}$ or indexes $I_{xyn}$ and $I_{xy0}$ thereof may be adopted.

In this way, the part disassemblability evaluation scores $E_i$ indicating the disassemblabilities of the parts are determined, details of which will be described below.

At first, it is assumed that a part standard $b$ for a part $i$ has one standard element $X_0$ corresponding to one basic element indicating a disassembling operation of the part $i$ and a predetermined size $l_b$ as the supplementary element, and that the environmental condition for the part standard $b$ is the same as that for the part $i$. The part standard disassembling cost $C_{bi}$ is determined on the basis of the data illustrated in FIGS. 4 and 5.

Next, the basic elements $X_{ij}$, the supplementary elements $Y_{nij}$ and the disassembling costs $C_{xynij}$ of the part $i$ at every sequential disassembling step $j$ are determined on the basis of the data shown in FIGS. 4 and 5. Hereinafter, the disassembling cost $C_{xynij}$ is represented by $C_{ij}$ in abbreviation.

A sum total $\Sigma C_{ij}$ resulting from addition of the disassembling costs $C_{ij}$ at the sequential steps $j$ represents the part disassembling cost $C_i$. Namely, $$C_i = \Sigma C_{ij}.$$

When this part disassembling cost $C_i$ increases beyond the disassembling cost $C_{bi}$ for the part standard, the part disassemblability evaluation scores $E_i$ of the part of concern is calculated in accordance with a function formula whose value decreases or increases from a predetermined value (100). Namely, $$E_i = 100 \pm e_i = 100 \pm g_i(C_i)$$
$$= f_2(C_i')$$

where $e_i = g_i(C_i)$ represents a part elimination score which increases when the part disassembling cost $C_i$ increases beyond the part standard disassembling cost $C_{bi}$. By placing in the expression for the part elimination score $e_i$ $\epsilon_x = f_1(C_x)$, $\alpha_n = [C_{xyn}/C_X]x_{mean}$ determined previously, then $$e_i = g_1\left(\sum C_{ij}\right) = g_i\left(\sum C_{xynij}\right)$$

$$= g_1\left\{\sum (\alpha_{nij} \cdot C_{xij})\right\}$$

$$= g_1\left[\sum \{\alpha_{nij} \cdot f_1'(\epsilon_{xij})\}\right]$$

$$= g_2(\alpha_{nij} \cdot \epsilon_{xij})$$

where $$C_{xyn}/C_x = (C_{xyn}/C_X)X_{mean} = \alpha_n$$

and $f_1'$ represents an inverse function of $f_1$.

Thus, $E_i = 100 \pm g_2 (\alpha_{nij} \cdot \epsilon_{xij})$. By using this expression, it is possible to calculate the basic elimination scores $\epsilon_{xij}$ and the supplementary coefficients $\alpha_{nij}$, which correspond to the basic elements $X_{ij}$ and the supplementary elements $Y_{ij}$, respectively.

Further, by substituting the part disassemblability evaluation scores $E_i$ determined in accordance with the expression $E_i = 100 \pm g_2 (\alpha_{nij} \cdot \epsilon_{Xij})$ for $E_i$ in the expression $E_i = f_2(C_i)$, the part disassembling cost $C_i$ can be determined.

This is advantageous because part disassemblability evaluation scores $E_i$ and the part disassembling cost $C_i$ can be calculated on the basis of a simple drawing from which data of the disassembling cost $C_X$ and $C_{xyn}$ shown in FIGS. 4 and 5 are not available.

It should be mentioned that in place of the disassembling costs $C_{bi}$ and $C_{xynij}$, the disassembling times $T_{bi}$ and $T_{xynij}$ as well the indexes $I_{bi}$ and $I_{xynij}$ thereof may be used. Further, by using a part coefficient $e_i'$ in place of the part disassemblability elimination scores $e_i$, the part disassemblability evaluation scores $E_i$ can be determined in accordance with $E_i=100 \cdot e_i'$. It should however be noted that $e_i'=g_i'$ ($C_i$) represents the part coefficient which increases or decreases as the part disassembling cost $C_i$ increases beyond the part standard disassembling cost $C_{bi}$.

After the part disassemblability evaluation scores $E_i$ and the part disassembling costs $C_i$ for all the parts have been determined in this way, then the article disassemblability evaluation score E and the article disassembling cost C of the article of concern are determined.

Namely, calculation is performed in accordance with $C=100 \pm e=100 \pm g_3$ (C)=$f_3$ (C).

It should be added that $e=g_3$ (C) represents an article elimination score which increases or decreases when the article disassembling cost $C=\Sigma C_i$ increases beyond $\Sigma C_{bi}$.

By placing $E_i=f_2$ ($C_i$) determined previously in the expression for the article disassemblability evaluation score E, then $$E = f_3(C) = f_3\left(\sum C_i\right)$$

$$= f_3\left[\sum \{f_2'(E_i)\}\right] = f_4(E_i)$$

where $f_2'$ represents an inverse function of the function $f_2$.

In place of the disassembling costs C, $C_i$ and $C_{bi}$ mentioned above, the disassembling times T, $T_i$ and $T_{bi}$ or the indexes I, $I_i$ and $I_{bi}$ thereof may be used. Further, by using an article coefficient e' in place of the article elimination score $\underline{e}$, it is possible to determine the article disassemblability evaluation score E as E=100e', where $e'=g_3$ (C) represents an article coefficient which increases or decreases when the article disassembling cost C increases beyond $\Sigma\ C_{bi}$.

Thus, while the part disassemblability evaluation scores $E_i$ represents an index indicating the degree of easiness for disassembling the part, the article disassemblability evaluation score represents an index indicating the degree of easiness with which the article as a whole can be disassembled. Since an approximate expression of $f_4$ ($E_i$) can be given by ($\Sigma\ E_i$)/N, the following expression may equally apply valid as well.

$$E = \frac{\sum E_i}{N} = \overline{E_i'} \tag{7}$$

where N represents a number of the parts involved in the disassembling.

In the calculation of the article disassembling cost C and the part disassembling cost $C_i$ as well as the times T and $T_1$ required for the disassembling operations, when the disassembling costs C' and $C_i'$ of an existing article and parts bearing similarity to those under evaluation as well as real values T' and T required for disassembling them, are known, relations between the article disassemblability evaluation score E and the part disassemblability evaluation scores $E_i$ of the article and the parts under evaluation as well as the article disassemblability evaluation score E' and the part disassemblability evaluation scores $E_i'$ of the existing similar article and part, and the disassembling cost C for the article under evaluation, the disassembling cost $C_i$ for the part of concern, the disassembling cost C' for the similar article and the disassembling cost $C_i'$ for the similar part, may be modified as follows:

$$c_i^{C_i'} = f_5 (E_i, E_i') \tag{8}$$

$C_i = C_i' f_5 (E_i, E_i')$.

Since the concern is the comparison with the similar part, the function $f_5$ is derived on the assumption that the formula and the constants as involved are same.

$$c^C = f_6 (E, E') \tag{9}$$

$C = C' f_6 (E, E')$.

Since the concern is the comparison with the similar part, the function $f_6$ is derived on the assumption that the formula and the constants are same.

The two expressions for determining the article disassembling cost C and the part disassembling cost $C_i$ as mentioned above are very profitable because a large amount of data for the disassembling cost $C_x$, $C_{xyn}$ and the constants for the functions $f_2'$ and $f_3'$ as shown in FIGS. 4 and 5 in the various work and processing environments as required for the following functions mentioned hereinbefore can be rendered unnecessary.

$C_i = \Sigma C_{ij}$ (where $C_{ij}$ is determined from the data shown in FIG. 4)

$c_i = \Sigma C_i$ $C_i = f_2'(E_i)$ $C = f_3'$ (E)

In place of the disassembling costs C, $C_i$, C' and $C_i'$, the disassembling times T, $T_i$, T' and $T_i'$ or the indexes I, $I_i$, I' and $I_i'$ thereof may be used.

FIG. 6 shows, by way of example, results of evaluation as outputted. In FIG. 6, the results of evaluation for an article of concern are shown in an upper half. The results of evaluations for parts of concern are shown in a lower half. As can be seen from the lower half of FIG. 6, the system has a display function in which the results of evaluations are displayed in the descending order of the evaluation scores, which are indexes indicating easiness of works and processings which the parts undergo (in the order from large to small indexes indicating the degrees of difficulty of the works and the processings, i.e., in the sequence in which difficulty of the works and the processings increases). Besides, for the basic elements extracted from the contents of the works and the processings performed on the parts, the system is imparted with a display function in which the indexes indicating the degrees of difficulty of the works and the processings performed on the parts, are displayed in descending order. Thus, items which are to be improved in design can be indicated to the evaluator for each of the parts and each of the contents of the works and the processings.

Furthermore, in order to indicate to the evaluator, the degrees of improvements of the easiness of the works and the processings for the article and the parts before design improvement and for the article and the parts after the improvement, the system is also imparted with a function for displaying reduction ratios indicating to what extent the times or costs required for the works and the processings are reduced after improvement when compared with those before the improvement.

Figure 7:
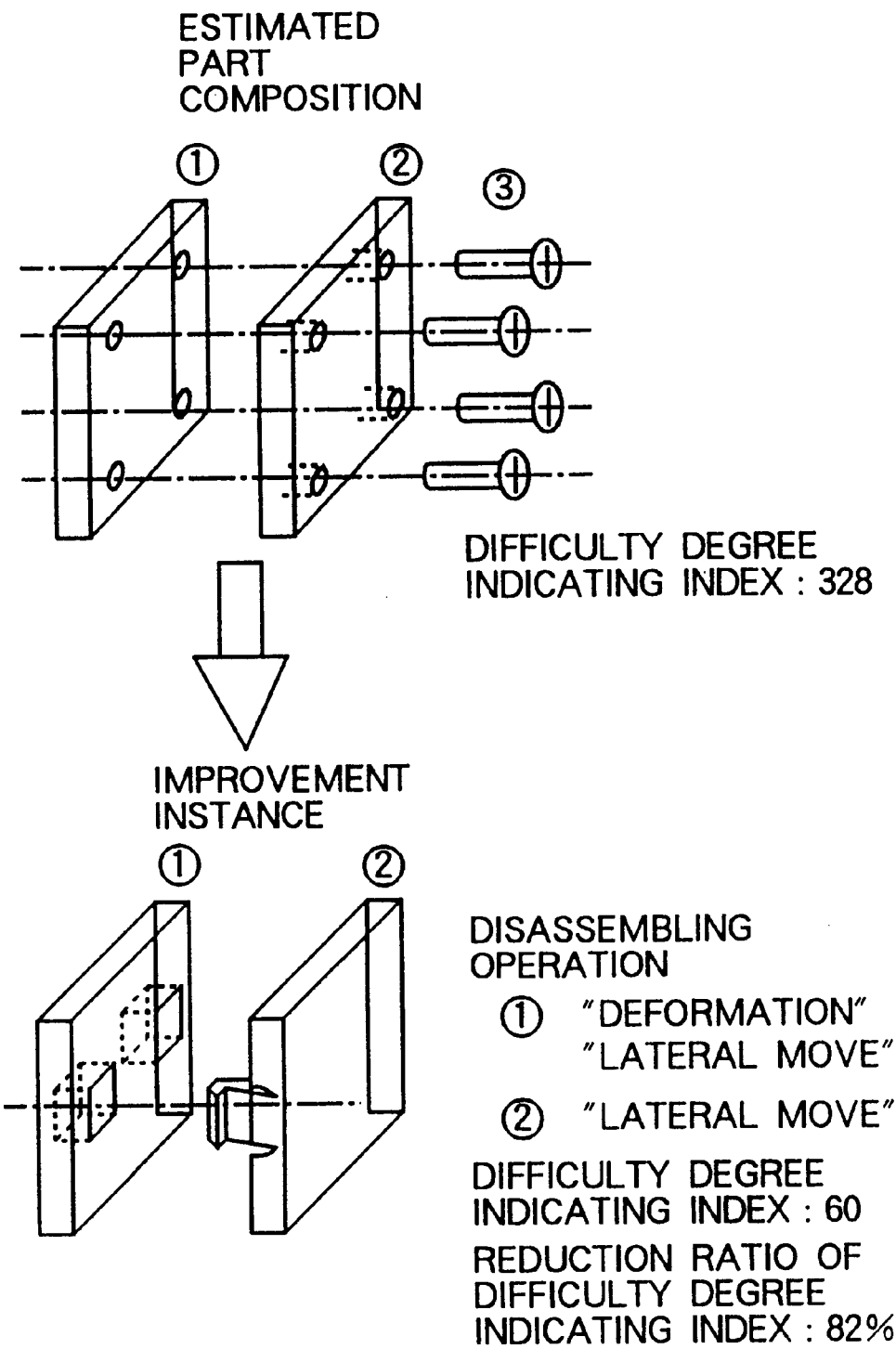
FIG. 7 shows an example of display for an improvement instance according to the present invention.
Figure 8:
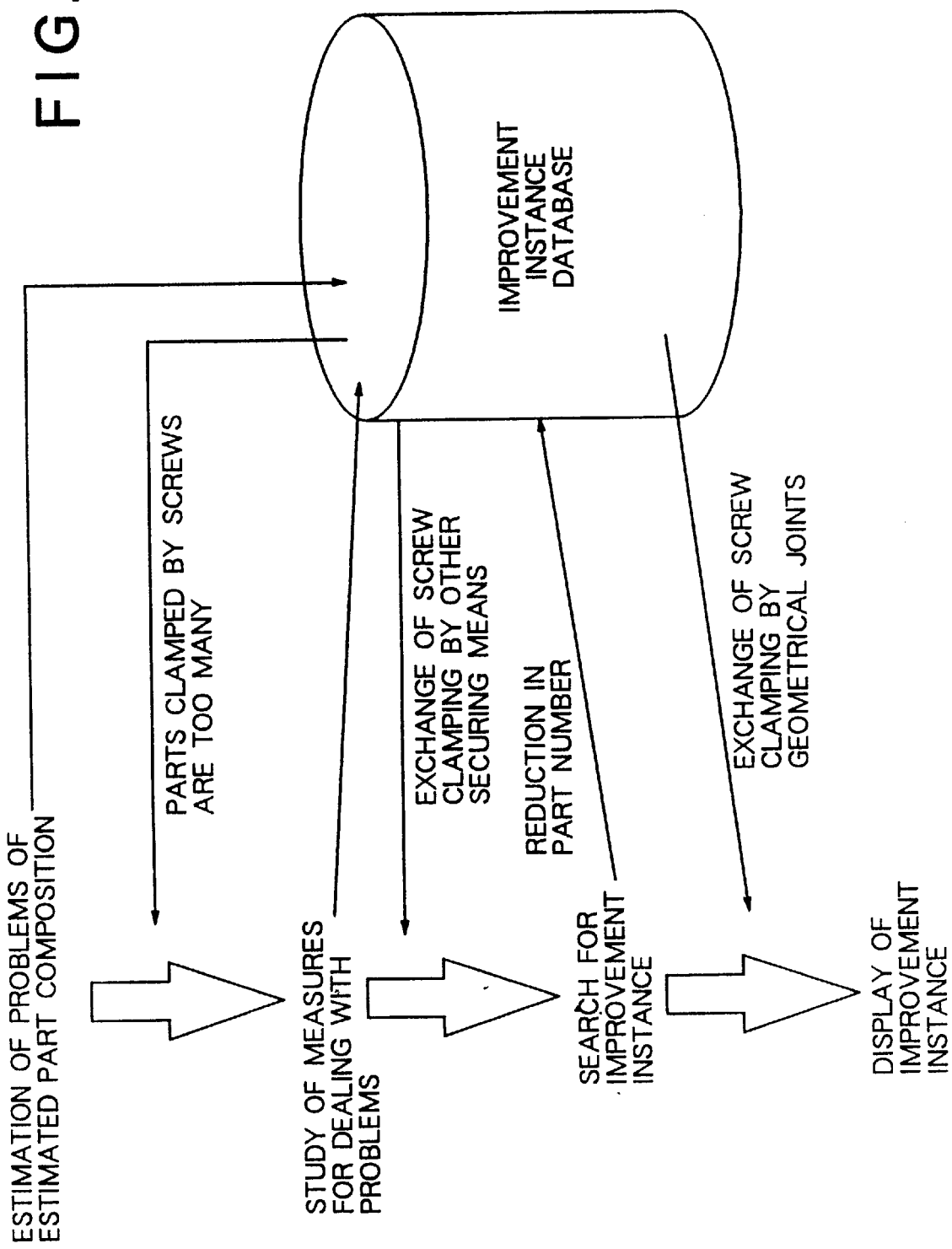
FIG. 8 shows, by way of example, a procedure for searching a design improvement instance according to the present invention.

FIG. 7 shows an example of display for an exemplary instance of improvement for easing or facilitating works and processings. FIG. 8 shows a search/retrieve method for design improvement instances. In the case of this improvement instance, it is assumed that analyses mentioned below are performed:

| screws | basic | "screwwise | "lateral |
| four | elements: | rotation" | moves" |
| flat sheet | basic | "lateral | |
| one | element: | move" | |
| flat sheet | basic | "upward move" | |
| one | element: | | |

For displaying the improvement instances, the evaluator is required to estimate the contents of the works and the processings to be performed on an article or parts thereof on the basis of combinations of the basic elements and the supplementary elements extracted by the evaluator and other information, and estimate at least one of structures of the article or parts thereof for which the works and the processings of concern are to be performed. On the other hand, the system is imparted with a function for displaying, as at least one improvement instance, an exemplary structure of the article or parts thereof which serves for similar function as the estimated article or parts thereof, and which makes the work and the processing easier when compared with the estimated article or parts thereof. It is presumed that for the estimation of the structure of the article or parts thereof for which the work and the processing estimated on the basis of the basic elements and others are required as well as for the search or retrieval of the improvement instance for the estimated structure, an improvement instance database prepared beforehand and stored in the storage or in the external storage unit is used.

In the case of the improvement instance shown in FIG. 7, because the work and the processing for the article is completed by operation "screwwise rotation/lateral move" performed on four screws (the screws can be estimated from the basic element "screwwise rotation") and operations "lateral move" and "upward move" performed on the two parts (estimation of configuration of the parts except for the screws is impossible), the part composition shown in the upper half portion of FIG. 7 is estimated. Where two or more part compositions are conceivable for a same contents of analysis, the evaluator can select the estimated part composition which approximates most closely the actual design with the aid of a corresponding function of the system.

Now, referring to FIG. 8, for the part composition as estimated or selected, a cause which incurs a large index indicating the degree, of difficulty of the work and the processing as involved, is estimated as a problem on the basis of data contained in the improvement instance database, whereupon measures for coping with the problem is searched from the improved instance database. In this conjunction, examination of the reduction in the part number as the condition of estimating an improvement draft, is found to be always effective for diminishing the index, indicating the degree of difficulty of the work and the processing.

Next, by referencing the improvement draft, the improvement instance is searched from the improvement instance database, whereupon the part composition improved correspondingly is outputted.

The improvement instance has an article structure or a part composition which has the same function as the article or the part composition estimated from the result of analysis or selected by the evaluator, and which facilitates the work and the processing when compared with the latter. An example of the improvement instance as displayed is shown in a lower half portion of FIG. 7. This example shows that the easiness of the work and the processing of the article or parts thereof, can be enhanced by coupling together two parts using a geometrical coupling designed to facilitate the work upon disassembling, instead of using four clamping screws. When two or more improvement instances are available as in the case of the part composition, these improvement instances are displayed sequentially enabling the evaluator to select the most appropriate one from the displayed improvement instances.

Subsequently, the basic elements and others required for the work and the processing for the article or parts of the improvement instance, are displayed while the index indicating the degree of difficulty is calculated and compared with the index indicating the degree of difficulty of the work and the processing of the article or parts thereof before improvement, thereby indicating to what extent the index indicating the degree of difficulty of the work to be performed on the article or parts thereof, can be diminished after the improvement when compared with the index before the improvement. This function is imparted to the system.

It is presumed that such improvement instance which has similar function as the article or the part composition thereof before improvement, is displayed on the basis of the article or the part composition thereof estimated on the basis of the results of analysis for the content of works to be performed on the article or parts thereof before improvement or selected by the evaluator. In that case, advantages/disadvantages brought about by adopting the improvement instance may be displayed, thereby facilitating the design improvement.

However, there may exist such a case where the estimated structural contents of the articles or parts thereof for all the combinations of the basic elements are unavailable. The same holds true for the improvement instances. Besides, the improvement instance may be inappropriate depending on the type of the article. Under the circumstances, it is desirable to update the content of the improved instance database as occasion requires. Thus, the system is imparted with a function capable of performing data addition/deletion/alteration for the improved instance database. Further, by adding an improved instance database prepared by the evaluator himself or herself to the improved instance database, it is possible to store cumulatively the known-how information of the user. Further, by adding an improved instance database of the other user, it is possible to realize a more effective improved instance database. By way of example, by incorporating the evaluation and improvement instance display function according to the invention in a CAD system, a designer can register information of a drawing as designed and results of evaluation thereof as improvement instance data.

Figure 9:
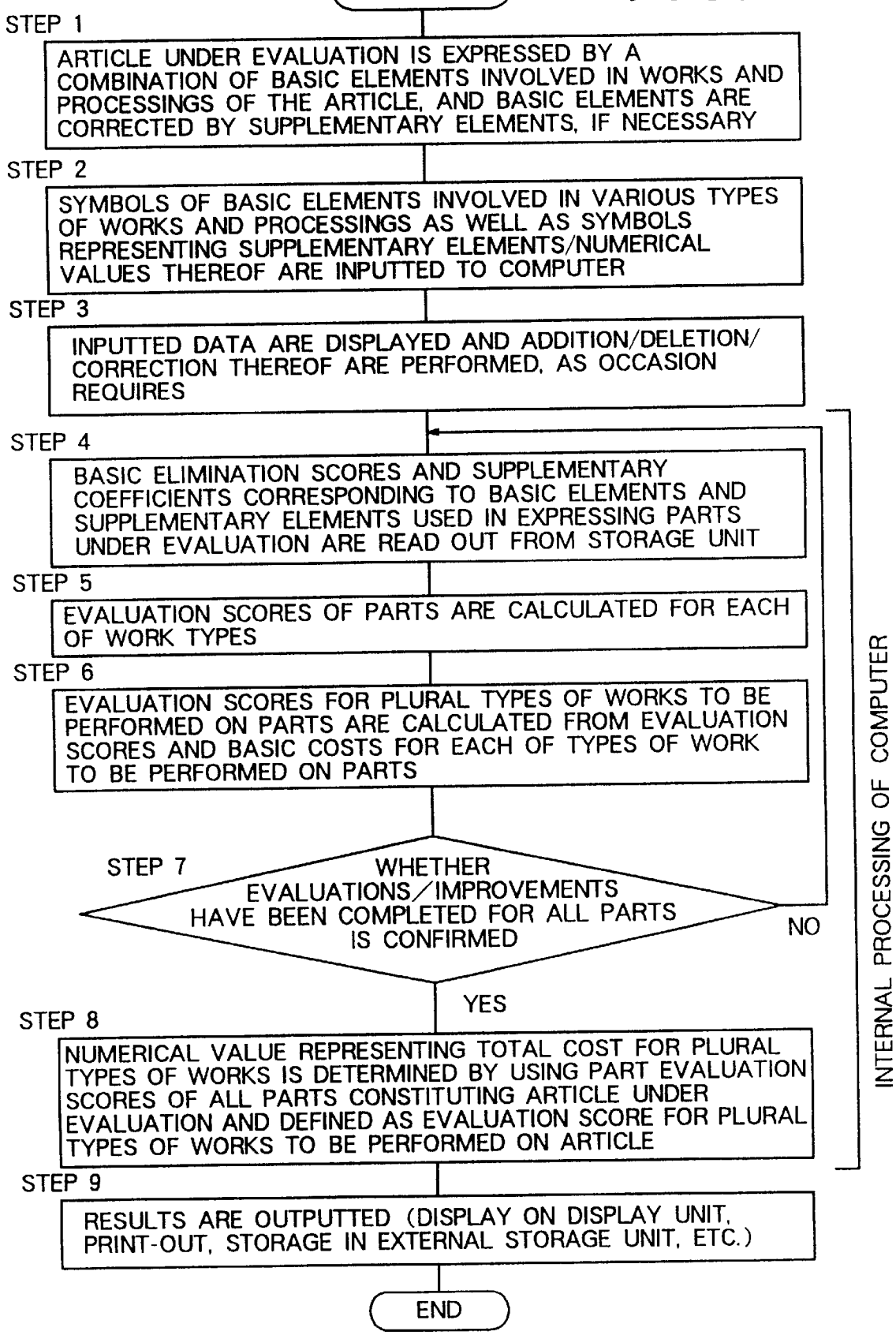
FIG. 9 is a diagram illustrating an evaluation process according to the present invention.

FIG. 9 illustrates an operation procedure executed by a computer system.

In a step 1, the works and the processings of various types to be performed on an article under evaluation are represented by basic elements. The basic elements are each corrected by using respective supplementary elements, if necessary. However, unless the exact symbol is available, the symbol for the basic element having the closest content is selected.

In a step 2, "symbols representing basic elements for the works and the processings of various types, symbols representing associated supplementary elements, numerical values, etc. are inputted to the computer" on a part-by-part basis.

By conducting the operations mentioned above for all the parts constituting the article under evaluation, the computer automatically calculates on a part-by-part basis, the evaluation scores of the article and the work costs or work times as well as processing costs or processing times wholly or partially. The results are then displayed on the display unit and at the same time printed out, as occasion requires.

As for the input data, the basic elements and the supplementary elements are inputted on a part-by-part basis. As for the inputting methods, the following may be mentioned.
(1) Method of inputting directly from a keyboard.
(2) Method of displaying basic elements and supplementary elements on a display unit and inputting the basic element and the supplementary element by selecting with the aid of a mouse or moving correspondingly a cursor.
(3) A method of allocating previously symbols of basic elements and supplementary elements to the individual keys and inputting them by depressing the corresponding keys.
(4) A method of inputting through a dedicated input unit (such as a tablet) prepared previously. The inputting method (1) is convenient when the initial alphabetic characters of the basic elements and the supplementary elements are used as the symbols, while the methods (2), (3) and (4) are recommended when the basic elements and the supplementary elements are difficult to represent by using alphabets or when the user is not accustomed to manipulate the keyboard.

Embodiment 2

In the case of the first embodiment, the basic elements and the supplementary elements have respective basic elimination scores ex and supplementary coefficients $\alpha_n$. The easiness of the work and the processing is determined by combining the values of the basic elimination scores ex and the supplementary coefficients $\rho_n$ with the basic elements and the supplementary elements inputted by the evaluator. In contrast, there can be conceived a method of determining the easiness of the work and the processing for an article or parts thereof on the basis of basic elements and supplementary elements as given through a procedure described below.

It should first be mentioned that the outline of the life of an article and various types of works or operations which the article undergoes as described hereinbefore by reference to FIG. 1 in conjunction with the subject matter of the invention in the first embodiment, as well as the basic flow illustrating the design and the evaluation arithmetics for the article or parts thereof as described previously by reference to FIG. 2, and the computer system on which the evaluation program according to the invention runs, as described previously by reference to FIG. 3, equally hold true for the instant embodiment.

However, software incorporated in the hardware shown in FIG. 3 is implemented in a configuration which will be described below. The contents stored in the storage unit 16 includes information such as names, numerical values, etc. assigned to articles or parts thereof under evaluation, data for analysis such as the work and the processing elements corresponding to the contents of the works and the processings, an analysis database for estimating the contents of the work and the processing for the article or parts thereof on the basis of the analysis data, contents of the work and the processing estimated from the analysis database, basic indexes indicating degrees of difficulty of the works and the processings, an improved instance database and programs serving for function of inputting/display/addition/deletion/correction of the basic elements, etc., as extracted in the processing steps of an evaluation process shown in FIG. 14, a function for outputting results of evaluations to the printer 25 and the display unit 26, a function for performing search and display of an improvement instance, a function for adding the improvement instance to the improved instance database, and others.

FIG. 10 shows, by way of example, a basic element. As the number of the basic elements increases, evaluation accuracy can be enhanced, although handling of them becomes more difficult. On the contrary, as the number of the basic elements becomes smaller, the extraction process becomes simplified, although the evaluation accuracy is lessened. It has been found that twenty elements is preferable from the practical standpoint. However, a greater number of the basic elements will provide no material obstacle. For these basic elements, predetermined contents of the works and the processings are defined and can be extracted from the information entered in a design drawing or an article or parts thereof. In FIG. 10, the name of the basic element is shown in a first column, while in a second column, symbols corresponding to the individual basic elements are shown. At this juncture, it should be mentioned that the symbols should preferably determined so that the corresponding basic elements can easily be associated, thereby mitigating the burden imposed on the evaluator. By way of example, an upward move may be represented by "¶", while a lateral move may be represented by "→".

FIG. 11 shows an example of the supplementary element. With the supplementary elements, it is intended to mean those items which can be designated on the basis of information written on a design drawing or can be extracted from an article or parts and which have influence to the disassemblability of parts in addition to the basic elements. As for the supplementary elements, there may be mentioned the materials, sizes, mounting positions, etc., of the parts. Of course, other items may be conceived.

The supplementary elements can be classified into those utilized in estimating the contents of the work and the processing of the article or parts thereof from combinations of the basic elements, and those which are used for calculating the time and the cost involved in the work and the processing estimated on the basis of data contained in the analysis database.

As an example of the supplementary element utilized in estimating the content of the work and the processing for the article or parts thereof, there may be mentioned position(s) at which the article or parts thereof are to be mounted. By way of example, when a supplementary element "a vertical position or height for mounting a part is low" is attached, move such as "sit-down" or "stand-up" is added upon estimation of the contents of the work and the processing from the analysis database.

In contrast, as an example of the supplementary element used in calculating the time or cost involved in the work and processing for the contents of the work and processing estimated on the basis of the analysis database, there may be mentioned an item which indicates a weight of the article or part. When the weight of the article or parts thereof increases, the time or the cost as involved in the work and processing generally tends to increase even when the contents of the work and processing is same. Consequently, when the supplementary element of this type is taken into consideration, correction is performed for the time and the cost required for the work and the processing as calculated by multiplying the time or cost involved in the work and processing as calculated, in accordance with the conventional rule, by a numerical value not smaller than "1" (one) as the supplementary coefficients $\alpha_n$. It should be mentioned that the supplementary coefficients $\alpha_n$ not greater than "1" (one) may exist, depending on the types of the supplementary elements.

Exemplary contents of the analysis database referenced for estimating the contents of the work and the processing for an article or parts thereof on the basis of basic element are illustrated in FIG. 12. More specifically, on the basis of input information such as names of parts, number of parts, etc., shown in a first column of FIG. 12, basic elements listed in a second column of FIG. 12 and supplementary elements listed in a third column of FIG. 12, contents of work and the processing listed in a fourth column of FIG. 12 are estimated. By way of example, from a supplementary element indicating that a screw is positioned within a hole of a great depth, it is expected that a worker will encounter difficulty in grasping the screw in the actual work and the processing. Further, from the supplementary elements indicating the screwwise rotation and the upward move, the content of the work and processing for which a screw-driver is used, can be estimated. By modifying the processing procedure estimating database in dependence on workshops and products, it is possible estimate work procedures which correspond to a variety of work environments and products.

By virtue of the analysis database of the type mentioned above, the evaluator is required only to load simple input information. Then, the system automatically transforms the input information into detailed analysis contents by taking into account the situation, whereby the evaluation can be effected with high accuracy.

In FIG. 12, there is shown at a fifth column, examples of the basic indexes indicating degrees of difficulty for the works and the processings of articles or parts thereof under evaluation or the basis of the contents of the works and the processings as estimated. The basic indexes include those which indicate by itself the degree of difficulty of the content of work and the processing, and those which indicate a degree of difficulty for a combination of several works and the processings in which a series of operations are involved such as in the case of the work and the processing for detaching screws by using a screw-driver. Further, some of the basic indexes may assume values which are altered by the supplementary elements.

Further, as can be seen from examples shown in FIG. 12 at the fourth and fifth columns, in the case where the number of the same parts is not smaller than two, the contents of the work and the processing as well as the index indicating the degree of difficulty as estimated, is not necessarily twice as large an amount required as the work and the processing, when the number of the part is one. By way of example, in the work and the processing such as a work for removing screws which requires use of a tool such as a screw-driver, work for picking up the tool from a tool box is performed before detaching a first part while work for storing the tool is performed after detachment of the last part.

A sum total of the basic indexes listed in the fifth column of FIG. 12 represents an index indicating of the degree of difficulty of the work and the processing for the article or parts thereof under evaluation.

On the basis of the index indicating the degree of difficulty for the article or parts thereof calculated in this way, an evaluation score for the article and the part can arithmetically be determined as an easiness index indicating easiness of the work and the processing for the article or parts thereof, details of which will be described below.

A sum total $G_i$ of the indexes indicating degrees of difficulty for the works and the processings of parts indicates times or costs involved in the works and the processings for the parts in terms of a ratio to a basic index $G_{bi}$, indicating the degree of difficulty of works and the processings for those parts which have states serving as standards under the same manufacturing environmental conditions. More specifically, the part under evaluation requires a time or cost for the work and the processing which corresponds to a value of the time or cost involved in the work and the processing for the part having the standard state and multiplied by a cost factor N calculated in accordance with the following expression:

$$N = {}_{G_{bi}}8^{G_i} \qquad (10)$$

As for the state of the article or parts thereof serving as the standard, it is presumed that the state of the article or parts thereof for which the work and the processing can be completed only through work and the processing whose index indicating the degree of difficulty is smallest, i.e., the work and the processing can be performed only with basic elements whose indexes indicating degrees of difficulty is adopted.

FIG. 13 shows a result of evaluation for the work and the processing of an article or parts thereof having standard states. This result of evaluation has been obtained by analyzing the work and the processing for an article or parts thereof for which the work and the processing can be realized only by an upward move operation which is one of the basic indexes having a smallest value of index indicating a degree of difficulty for work and the processing involved in a disassembling process. A sum total of indexes indicating the contents of works and the processings as involved in the disassembling process is given by $G_{bi}$.

When the index indicating the degree of difficulty for the work and the processing of an article or parts thereof is N times as large as that for the part having the standard state, the evaluation score (E) which is an index indicating easiness of work and the processing for that article or parts thereof is calculated in accordance with a function which decreases or increases from a predetermined value. Namely, $$E = 100 \pm f_7(N)$$

By adopting "100" as the predetermined value, the evaluation score can be obtained which represents an easiness index for the work and the processing relative to the work and the processing whose evaluation score is a full score of "100".

The time or cost required for the work and the processing of an article or parts thereof under evaluation can be estimated through a procedure described before.

The time or cost required for the work and the processing of an article or a part thereof having a standard state in a same environmental condition can be determined by measurement under that environmental condition and by calculation in which the environmental condition is taken into account. $T_{bi}$ or $C_{bi}$ represent the time or the cost required for the work and the processing of an article or a part thereof having a state serving as the standard. An estimated value (represented by $T_{fi}$ or $C_{fi}$) of the time or the cost required for the work and the processing of an article or parts thereof under evaluation can be calculated in accordance with $$T_{fi} = T_{bi} \times N$$

$$C_{fi} = C_{bi} \times N.$$

By using the cost or time involved in disassembling a part, the evaluation score of that part can be determined in accordance with the method described hereinbefore in conjunction with the first embodiment.

As for the time $T_{bi}$ or the cost $C_{bi}$, the time or cost required for the work and the processing of articles or parts thereof having standard state in a same manufacturing environmental condition is usually employed. However, it is equally possible to use in substitution a value derived in a similar manufacturing environmental condition. In that case, however, it must be taken into consideration that the time $T_{fi}$ or the cost $C_{fi}$ estimated has a deviation corresponding to difference between the same environmental condition and the similar environmental condition.

Figure 14:
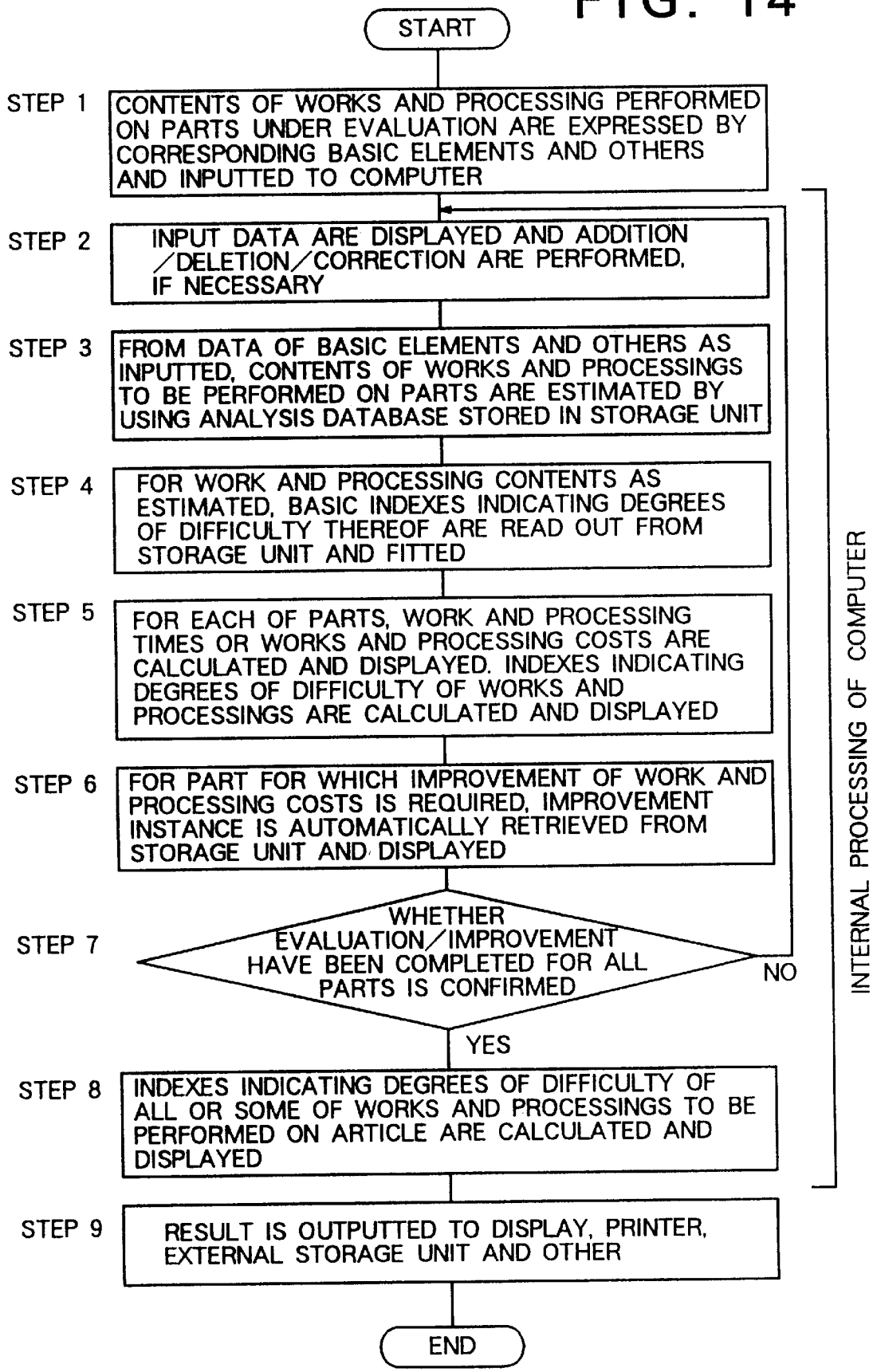

Referring to FIG. 14, the procedure performed by the computer system will be explained.

In a step 1, contents of work and processing for a part under evaluation is expressed in terms of a combination of the basic elements. The individual basic elements are inputted to the computer together with supplementary elements, as occasion requires. Those parts for which the contents of work and processing are difficult to express with the basic elements, are represented by symbols of the basic elements having most similar. In a step 2, input data are confirmed. Addition, deletion, correction and other processing of the data may then be performed.

By carrying out the processings mentioned above for the article under evaluation or all the parts thereof, the times or costs are all or partially calculated automatically. The results are then displayed on a display unit and outputted to a printer, if desired. Additionally, an improvement instance is automatically retrieved and displayed for aiding the user in improving the design.

As will now be understood from the foregoing description, according to the present invention, easiness of the works and the processings which an article or parts thereof undergoes at various stages of life and particularly in maintenance/inspection/repair, dismantling, disassembling and recycling for resource, can be evaluated:

(1) at an earlier stage of design and development process,
(2) easily without need for abundant experiences and knowledges,
(3) in the form quantitatively understandable by any one in respect to satisfactoriness of design structure, materials and others in addition to the time required for the work and the processing or the cost involved in the work and the processing.

As a result, the designer can evaluate and improve his or her design at an early stage of design process. Further, by virtue of the availability of instances for reference in improving the design, it is possible to prompt the designer so that the design of high quality in respect to the easiness of work and processing, can be realized within a short time span.

We claim:

1. A method of evaluating quantitatively whether an article has a structure which facilitates work to be performed thereon with the aid of a computer, comprising:

processing for registration in said computer and processing for evaluating easiness of work to be performed on an article under evaluation, wherein said processor for registration in said computer includes the following steps:

(a) classifying into basic elements plural types of state for parts comprising said article and inputting through an input unit and registering in a basic element storage part of a storage unit at least one value of work cost and required time and indexes thereof as involved in performing the work on a part having said basic elements in a standard state together with corresponding identification symbols of said basic elements, (b) classifying into supplementary elements plural types of factors other than said basic elements which exert influence to the work cost and the required time for each of said basic elements and the indexes thereof, respectively, and inputting through said input unit, and registering in a supplemental element storage part of said storage unit values of standard work costs and standard required time involved in the work to be performed on said parts in each of said states and indexes thereof, together with corresponding identification symbols of said supplementary elements, respectively, (c) selecting and registering to be inputted, those basic elements which represent predetermined states to serve as standard elements from said basic elements while inputting supplementary standards representing predetermined states serving as standard for said registered supplementary elements, respectively, both of said standard elements and said supplementary standards being registered in a standard storage part of said storage unit, (d) determining basic elimination scores indicating degrees of difficulty of the works to be performed for said basic elements on the basis of at least one of the work costs, the required times and the indexes thereof for said basic elements, respectively, with reference to at least one of the work costs, the required times and the indexes thereof for said standard elements, and subsequently registering the basic elimination scores in said basic element storage part, (e) determining supplementary coefficients representing degrees of difficulty of the works for the states of said supplementary elements on the basis of at least one of the work costs, the required times and the indexes thereof for the states of said supplementary elements with reference to at least one of the work costs, the required times and the indexes thereof for supplementary standards of said supplementary elements, respectively, and subsequently registering the supplementary coefficients in said supplementary element storage part, said processing for evaluating the degree of difficulty of the article under evaluation being executed by the following steps in which:

(f) the identification symbols representing the basic elements and the supplementary elements for each of the parts constituting said article under evaluation are inputted through said input unit, (g) said basic element storage part and said supplementary element storage part are referenced on the basis of the inputted identification symbols representing the basic elements and the supplementary elements of each of said parts to thereby read out corresponding ones of said basic elimination scores and said supplementary coefficients, and part elimination scores are determined on the basis of said basic elimination scores and said supplementary coefficients as read out in accordance with a first index function prescribed such that an increasing value is given when at least one of the work cost, the required time and the indexes thereof for each of said parts increases as compared with at least one of work cost, required time and index thereof for a part standard corresponding to said part, and said part standard having said standard elements, and all of the supplementary elements other than the supplementary element representing size are the supplementary standards and each has a size of a predetermined ratio, (h) arithmetically determining a part-based work easiness evaluation score indicating the degree of difficulty of work for each of the parts by decreasing or increasing the part elimination score from a predetermined standard value, (i) determining an article elimination score on the basis of said part-based work easiness evaluation scores in accordance with a second index function which is so prescribed as to give an increasing value when at least one of the work cost, the required time and the indexes thereof for said article under evaluation as determined by summing at least one of the work costs, the required times and the indexes thereof increases as compared with at least one of the work cost, the required time and the indexes thereof for an article standard, said article standard being a standard of the article under evaluation which is assumed to comprise a combination of said part standards, (j) determining an article-based work easiness evaluation score indicating a degree of difficulty of the work for the article under evaluation by decreasing or increasing the value of the article elimination score from a predetermined standard value, and (k) outputting said article-based work easiness evaluation score through an output unit.

2. A design evaluating system for evaluating a design of an article or a part, comprising:

data storage means for storing predetermined relations between work factors required for handling first components comprising said article or part and work costs or working times involved in handling said components, and relations between other components which are to serve for a same sort of function as said first component;

data input means for inputting the work factors required for handling said first components as design data of said article or part;

data processing means responsive to the inputting of the work factors for the handling of the first components,
for deciding the working costs or working times corresponding to said inputted work factors for said first components, respectively,
for evaluating easiness of work involved in handling said article or part from the working costs or working times resulting from said deciding,
for determining an unsatisfactory first component from the evaluating, and,
for selecting one of the other components for the unsatisfactory component which other component serves for the same function as said unsatisfactory component; and data output means for outputting said selected other component.

3. A design evaluating system for evaluating a design of an article or a part, comprising:

data storage means for storing predetermined relations between work factors required for handling first selected components comprising said article or part and working costs or working times involved in handling said first selected components;

data input means for inputting the work factors required for handling the first selected components as one of design data of said article or part;

data processing means responsive to the inputting of the work factors,
for deciding the working costs or the working times corresponding to said inputted work factors for said first selected components, respectively,
for evaluating easiness of work involved in the handling of said article or part by deciding synthetically the working costs or working times for said first selected components, and,
for selecting certain ones of the first selected components to be improved on the basis of the evaluating of easiness; and data output means for outputting said certain ones of said first selected components to be improved on the basis of the result of said easiness evaluating.

4. A design evaluating system for evaluating a design of an article or a part, comprising:

data storage means for storing predetermined relations between work factors required for handling of said article or part and work cost or working time involved in handling;

data input means for inputting the work factors required for the handling of said article or part as design data for said article or part;

data processing means responsive to the inputting of the work factors required for the handling of said article or part as design data for said article or part for deciding the working cost or the working time corresponding to said inputted work factors and for evaluating easiness of work involved in the handling of said article or part on the basis of the working costs or working time resulting from said deciding; and data output means for outputting a result of said evaluating as design evaluation for said article or part.

5. A design evaluating method of making evaluation for a design of an article or a part, comprising the steps of:

storing predetermined relations between work factors required for handling first suggested components comprising said article or part and work costs or working times involved in the handling of said first suggested components and predetermined relations for other components which serve a same sort of function;

responding to inputting of the work factors required for handling the first suggested components as design data or said article or part by deciding the working costs or the working times corresponding to said work factors for said first suggested components, respectively;

evaluating easiness of work involved in handling said article or part by associating the working costs or working times for said components, which result from said deciding, and determining an unsatisfactory one of said first suggested components when said unsatisfactory one fails to satisfy a predetermined criterion; and outputting for the unsatisfactory one component an other component which serves a same sort of function as the unsatisfactory one.

6. A design evaluating method of making an evaluation for a design of an article or a part, comprising the steps of:

storing preselected relations between work factors required for handling first components comprising said article or part and working costs or working times involved in handling said first components;

responding to inputting of the work factors required for handling the first components as design data or said article or part by deciding the working costs or the working times corresponding to said work factors for said first components, respectively;

evaluating easiness of work involved in handling said article or part by determining the working costs or working times for said first components, and identifying a one of said first components requiring improvement based on the determining the working costs or working times; and, outputting the one component requiring improvement.

7. A design evaluating method of making evaluation for a design of an article or a part, comprising the steps of:

storing predetermined relations between work factors required for handling said article or part and work cost or working time involved in handling said article or part;

responding to inputting of the work factors required for handling said article or part as design data of said article or part for deciding the working cost or the working time corresponding to said inputted work factor;

evaluating easiness of work involved in handling said article or part on a basis of the working cost or working times resulting from said deciding; and outputting a result of said evaluating of the easiness of work as a design evaluation for said article or part.

* * * * *